US012028972B2

(12) United States Patent
Furushou et al.

(10) Patent No.: US 12,028,972 B2
(45) Date of Patent: Jul. 2, 2024

(54) WIRING BOARD AND MANUFACTURING METHOD OF THE WIRING BOARD

(71) Applicant: DAI NIPPON PRINTING CO., LTD., Tokyo (JP)

(72) Inventors: Hiroki Furushou, Tokyo (JP); Atsuko Chigira, Tokyo (JP); Toshio Sasao, Tokyo (JP); Hiroshi Mawatari, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 452 days.

(21) Appl. No.: 17/011,260

(22) Filed: Sep. 3, 2020

(65) Prior Publication Data
US 2020/0404781 A1    Dec. 24, 2020

Related U.S. Application Data

(63) Continuation of application No. PCT/JP2019/012249, filed on Mar. 22, 2019.

(30) Foreign Application Priority Data

Mar. 28, 2018  (JP) ................ 2018-061148

(51) Int. Cl.
*H05K 1/02* (2006.01)
*B32B 15/04* (2006.01)
(Continued)

(52) U.S. Cl.
CPC ........... *H05K 1/0298* (2013.01); *B32B 15/04* (2013.01); *H01L 23/40* (2013.01); *H05K 3/38* (2013.01)

(58) Field of Classification Search
CPC ...... H05K 1/0298; H05K 3/38; H05K 1/0306; H05K 3/381; H05K 3/388; B32B 15/04;
(Continued)

(56) References Cited

U.S. PATENT DOCUMENTS 4,713,494 A    12/1987  Oikawa et al.
4,885,213 A *  12/1989  Miyamoto .............. C23C 4/02
                                               428/632
(Continued)

FOREIGN PATENT DOCUMENTS

CN    107112297 A    8/2017
JP    H08-293654 A   11/1996
(Continued)

OTHER PUBLICATIONS

English Translation WO2014084077 (Year: 2014).*
(Continued)

*Primary Examiner* — Steven T Sawyer
(74) *Attorney, Agent, or Firm* — Oliff PLC

(57) ABSTRACT

A wiring board is disclosed. The wiring board includes a substrate including a first element, a diffusion layer in contact with the substrate and including a first metal element, and a first metal film in contact with the diffusion layer and including a second metal element. The diffusion layer has at least a region including the first element and the first metal element and a region including the first metal element and the second metal element. A concentration of the second metal element in the diffusion layer may decrease as it approaches the substrate in a depth direction. A concentration of the first element in the diffusion layer may decrease as it approaches the first metal film in the depth direction.

11 Claims, 14 Drawing Sheets

(51) Int. Cl.
   *H01L 23/40* (2006.01)
   *H05K 3/38* (2006.01)
(58) Field of Classification Search
   CPC . H01L 23/40; H01L 23/49827; H01L 21/486;
        C23C 18/1216; C23C 18/1254; C23C
        18/1692; C23C 18/38; C23C 18/1653;
        C23C 28/00; C23C 18/20; C25D 5/022;
        C25D 3/04; C25D 3/38; C25D 3/48;
        C25D 3/12; C25D 3/54; C25D 5/50
   See application file for complete search history.

(56) References Cited

U.S. PATENT DOCUMENTS

| | | | |
|---|---|---|---|
| 2003/0063229 | A1 | 4/2003 | Takahashi et al. |
| 2005/0110149 | A1 | 5/2005 | Osaka et al. |
| 2005/0249927 | A1 | 11/2005 | Suzuki et al. |
| 2008/0316715 | A1 | 12/2008 | Fujii |
| 2010/0012935 | A1 | 1/2010 | Hino et al. |
| 2010/0065322 | A1 | 3/2010 | Ogawa et al. |
| 2013/0026470 | A1* | 1/2013 | Terao ............... H01L 21/28518 257/E29.083 |
| 2013/0122323 | A1 | 5/2013 | Miki et al. |
| 2015/0048359 | A1 | 2/2015 | Fukase et al. |
| 2016/0208387 | A1* | 7/2016 | Liu ..................... C23C 18/1667 |
| 2016/0237571 | A1 | 8/2016 | Liu et al. |
| 2017/0223842 | A1 | 8/2017 | Chujo et al. |
| 2017/0250141 | A1 | 8/2017 | Imayoshi |
| 2018/0197959 | A1 | 7/2018 | Fujita et al. |
| 2020/0348451 | A1* | 11/2020 | Umeda .................. G02B 5/285 |
| 2021/0296204 | A1* | 9/2021 | Yumoto ............... H05K 1/0271 |

FOREIGN PATENT DOCUMENTS

| | | |
|---|---|---|
| JP | 2003-107523 A | 4/2003 |
| JP | 2005-158887 A | 6/2005 |
| JP | 2008-166742 A | 7/2008 |
| JP | 2008-282887 A | 11/2008 |
| JP | 2012-027159 A | 2/2012 |
| JP | 2013-125655 A | 6/2013 |
| JP | 2015-038925 A | 2/2015 |
| JP | 2016-533429 A | 10/2016 |
| JP | 2016-533430 A | 10/2016 |
| TW | 200515535 A | 5/2005 |
| TW | 200605184 A | 2/2006 |
| TW | 201251542 A | 12/2012 |
| WO | 2014/084077 A1 | 6/2014 |
| WO | 2017/002672 A1 | 1/2017 |

OTHER PUBLICATIONS

English Translation JPH08293654 (Year: 1996).*
English Translation JP2008282887 (Year: 2008).*
Jul. 20, 2022 Office Action issued in Chinese Patent Application No. 201980020134.0.
Jan. 4, 2023 Office Action issued in Japanese Patent Application No. 2020-509993.
Jun. 4, 2019 International Search Report issued in International Patent Application No. PCT/JP2019/012249.
Jun. 4, 2019 Written Opinion of the International Searching Authority issued in International Patent Application No. PCT/JP2019/012249.
Feb. 2, 2023 Office Action issued in Chinese Patent Application No. 201980020134.0.
Dec. 6, 2022 Office Action issued in TW Patent Application No. 108110408.
May 27, 2023 Office Action issued in Chinese Patent Application No. 201980020134.0.
Jun. 27, 2023 Office Action issued in Japanese Patent Application No. 2020-509993.
Nov. 6, 2023 Office Action issued in Korean Application No. 10-2020-7027438.
Nov. 7, 2023 Office Action issued in Japanese Application No. 2020-509993.
Apr. 24, 2024 Office Action issued in Taiwanese Application No. 112132341.

* cited by examiner

S1

S2

S3

S4

S10

110

S11

Δ

S12

Δ

S13

Δ

S17

S18

160

WIRING BOARD AND MANUFACTURING METHOD OF THE WIRING BOARD

CROSS REFERENCE TO RELATED APPLICATIONS

This application is a U.S. continuation application filed under U.S.C. § 111(a) of International Application No. PCT/JP2019/012249, filed on Mar. 22, 2019, which claims priority to Japanese Patent Application No. 2018-061148, filed on Mar. 28, 2018, the disclosures of which are incorporated herein by reference.

FIELD

The present disclosure relates to a wiring board in which a wiring is formed over a substrate, a manufacturing method of the wiring board, and a semiconductor device including the wiring board.

BACKGROUND

A fundamental component (hereinafter, referred to as a wiring board) including a substrate and a wiring provided thereover is generally employed in electronic apparatus. Such a wiring board not only independently functions as a semiconductor device but is also widely applied as a substrate (interposer) for connecting a variety of electronic parts or mounting semiconductor devices on electronic apparatus. A variety of methods has been developed for providing a wiring over a substrate. For example, a film containing a metal oxide is provided between an insulating substrate and a wiring in an attempt to improve adhesion between the substrate and the wiring in the methods disclosed in Japanese laid-open patent publications No. 2016/533430 and 2016/533429.

SUMMARY

An embodiment of the present disclosure is a wiring board. The wiring board possesses a substrate containing a first element, a diffusion layer in contact with the substrate and containing a first metal element, and a first metal film in contact with the diffusion layer and containing a second metal element. The diffusion layer has at least a region containing the first element and the first metal element and a region including the first metal element and the second metal element.

An embodiment of the present disclosure is a method for manufacturing a wiring board. The method includes: forming a first intermediate layer containing an oxide of a first metal element over a substrate containing a first element; converting the first intermediate layer to a second intermediate layer by diffusing the first element into the first intermediate layer; forming a first metal film containing a second metal element over the second intermediate layer; and converting the second intermediate layer to a diffusion layer by diffusing the second metal element into the second intermediate layer.

DESCRIPTION OF EMBODIMENTS

Hereinafter, each embodiment of the present disclosure is explained with reference to the drawings. The disclosure can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the disclosure. In the specification and the drawings, the same reference number is provided to an element that is the same as that which appears in preceding drawings, and a detailed explanation may be omitted as appropriate.

In the specification and the scope of claims, unless specifically stated, when a state is expressed where a structure is arranged over or under another structure, such an expression includes both a case where the substrate is arranged immediately above or under the other structure so as to be in contact with the other structure and a case where the structure is arranged over or under the other structure with an additional structure therebetween.

In the specification and the scope of claims, an expression "a structure is exposed from another structure" means a mode in which a part of the structure is not covered by the other structure and includes a mode where the part not covered by the other structure is further covered by another structure.

First Embodiment

In the present embodiment, a wiring board 100 according to an embodiment of the present disclosure is explained.

1. Structure

Figure 1A:
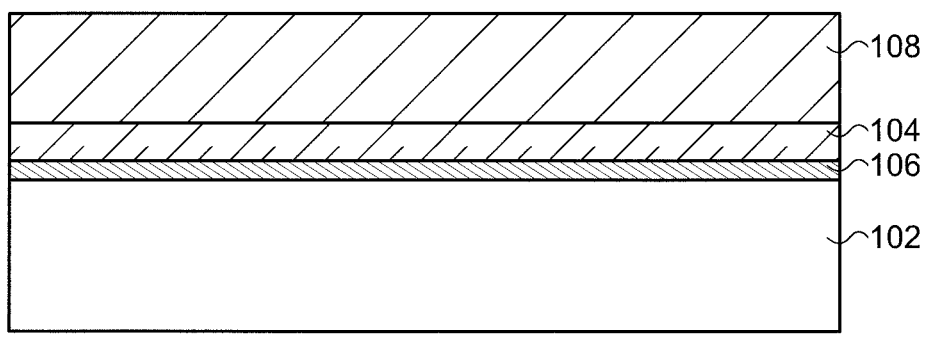
FIG. 1A is a schematic cross-sectional view of a wiring board according to an embodiment.

A schematic cross-sectional view of the wiring board 100 is shown in FIG. 1A. The wiring board 100 includes a substrate 102, a diffusion layer 106 over and in contact with the substrate 102, and a first metal film 104 over and in contact with the diffusion layer 106. The wiring board 100 may further possess a second metal film 108 over and in contact with the first metal film 104.

The substrate 102 contains a first element. Here, the first element is selected from elements other than oxygen and is included in a main component of the substrate 102. In the present specification and claims, a main component of a structure means a component predominating over 90 wt % or more of the structure. As the substrate 102, a glass substrate, a quartz substrate, a semiconductor substrate containing a semiconductor such as silicon, germanium, gallium arsenide, and gallium nitride, a ceramic substrate containing a ceramic such as alumina and zirconia, a substrate including a single crystalline metal oxide, such as a sapphire substrate, and the like are exemplified. In the case of a substrate containing glass as a main component, a resin may be composited. When the aforementioned substrates are employed, the first element is selected from silicon, germanium, aluminum, zirconium, arsenic, nitrogen, and the like.

Among the aforementioned substrates, a glass substrate is preferred when the wiring board 100 is utilized as an interposer of a semiconductor device because it is available at a low cost and exhibits excellent insulating properties. As glass contained in a glass substrate, soda-lime glass, fluoride glass, phosphate glass, borate glass, and the like are represented.

Surface roughness of the substrate 102 is not limited and may be equal to or more than 0.1 nm, equal to or more than 1 nm, or equal to or more than 5 nm. The surface roughness of the substrate 102 may be equal to or less than 200 nm, equal to or less than 100 nm, or equal to or less than 50 nm. The surface roughness of the substrate 102 may be equal to or more than 0.1 nm and equal to or less than 200 nm, equal to or more than 1 nm and equal to or less than 100 nm, or equal to or more than 5 nm and equal to or less than 50 nm. The surface roughness may be measured using an optical interferometry microscope, for example. When a wiring with a relatively small thickness is provided over the substrate 102, the surface roughness of the substrate 102 is reflected at the surface of the wiring. Adjustment of the surface roughness of the substrate 102 within the aforementioned range suppresses an increase in surface roughness of the wiring. Hence, in the case where the wiring board 100 is applied to a high-frequency circuit board, it is possible to reduce transmission loss. In addition, when the wiring is processed with photolithography, scattering of the light derived from a light exposure can be suppressed, thereby preventing microfabrication of the wiring from being disturbed.

Here, the surface roughness can be evaluated with an arithmetic mean roughness Ra which is a parameter represented by the following equation. In this equation, L is a measurement length on the substrate 102 to be evaluated, f(x) is a height when a direction of the measurement length is x. Ra is obtained by averaging the absolute values of the heights along the measurement length with the measurement length.

$$Ra = \frac{1}{L}\int_0^L |f(x)|dx$$

An example of the measuring methods of the arithmetic mean roughness Ra is as follows. First, a plurality of measurement regions is arbitrarily determined on the substrate 102. The measurement regions may each be a rectangle of a size of 0.30 mm×0.22 mm, for example. For instance, five points including four corners and a center of the substrate 102 may be selected as the measurement regions. Subsequently, two points are arbitrarily determined in each of the plurality of regions. The distance between these two points is set to be 0.1 mm which corresponds to the measurement length L. The arithmetic mean roughness Ra is measured between these two points, and an average of the arithmetic mean roughnesses Ra obtained in the plurality of measurement regions is employed as the roughness of the substrate 102. For example, when five positions on the four corners and the center of the substrate 102 are selected as the measurement regions, an average of the five measurement results is the surface roughness of the substrate 102. Note that, the measurement may be conducted a plurality of times in each of the measurement regions, and an average thereof may be used as the arithmetic mean roughness of one measurement region. The arithmetic mean roughness Ra may be measured with a 3D optical profiler equipped with a white light interferometer (e.g., 3D Optical Profiler Zygo NewView™ 5000 manufactured by Zygo Corporation or the like).

The first metal film 104 includes a 0 valent metal element (second metal element) and is able to function as a wiring of the wiring board 102 or a seed layer for fabricating a variety of wirings (not illustrated) provided over the second metal film 108 or the wiring board 100 with an electroplating method. As the second metal element, copper, titanium, chromium, nickel, gold, and the like are represented. There is no limitation to the thickness of the first metal film 104, and the thickness may be equal to or more than 0.5 µm, 10 µm, or 5 µm and equal to or less than 50 µm, equal to or less than 30 µm, or equal to or less than 20 µm, for example. The thickness of the first metal film 104 may be equal to or more than 0.5 µm and equal to or less than 50 µm, equal to or more than 1 µm and equal to or less than 30 µm, or equal to or more than 5 µm and equal to or less than 20 µm. It is possible to secure a sufficient conductivity as a wiring by arranging the thickness of the first metal film 104 in this range. Moreover, the first metal film 104 can be prepared in a short time even in the case where it is formed with a plating method. Even in the case where the first metal film 104 is fabricated with photolithography, microfabrication is also readily performed.

The diffusion layer 106 has a function to firmly adhere the first metal film 104 to the substrate 102, and therefore, is also called an adhesion layer. The diffusion layer 106 is formed by interdiffusion of an intermediate layer provided between the first metal film 104 and the substrate 102. The intermediate layer contains a first metal element. For example, the intermediate layer contains an oxide or nitride of a first metal, and zinc, titanium, zirconium, aluminum, tin, and the like are represented as the first metal. A region of the intermediate layer containing the first metal is defined as the diffusion layer 106. The thickness of the diffusion layer 106 may be equal to or more than 1 nm. This thickness range allows the diffusion layer 106 to follow the surface roughness of the substrate 102, by which not only high adhesion can be secured between the first metal film 104 and the substrate 102 but microfabrication thereof can also be conducted simultaneously with the first metal film 104. The thickness of the diffusion layer 106 may be equal to or less than 1 μm, equal to or less than 100 nm, equal to or less than 20 nm, or equal to or less than 10 nm. The thickness of the diffusion layer may be equal to or more than 1 nm and equal to or less than 1 μm, equal to or more than 1 nm and equal to or less than 100 nm, equal to or more than 1 nm and equal to or less than 20 nm, or equal to or more than 1 nm and equal to or less than 10 nm. This thickness range enables the formation of the diffusion layer 106 in a short time and does not permit an etching residue to be left over the substrate 102, thereby it is possible to securely insulate closely arranged wirings. For example, when the arithmetic mean roughness Ra of the substrate is 5 nm, the thickness of the diffusion layer 106 may be set in a range equal to or more than 10 nm and equal to or less than 20 nm.

2. Composition of Diffusion Layer

The first element contained in the substrate 102 and the second metal element contained in the first metal film 104 are also included in the diffusion layer 106 in addition to the first metal element. More specifically, the diffusion layer 106 includes at least one of a region in which the first element, the first metal element, and the second metal element coexist, a region in which the first metal element and the first element coexist, and a region in which the first metal element and the second metal element coexist. For example, the diffusion layer 106 may have the region containing the first metal element and the first element and the region containing the first metal element and the second metal element.

Hence, the thickness of the diffusion layer 106 is not the same as the thickness of the intermediate layer and may be defined as a thickness of a portion where at least one of the aforementioned regions exists. In this case, the thickness can be measured with an energy dispersive X-ray (EDX) analysis. Specifically, a sample in which at least the diffusion layer 106 and the first metal film 104 are arranged over the substrate 102 is processed using a focused ion beam (FIB) to expose a cross section, irradiating interfaces between the layers with an electron beam from the substrate 102 side, and characteristic X-rays are directed using a Si drift detector or the like. The atomic composition proportion (atomic %) of each element is obtained on the basis of the intensity of the characteristic X-rays. With this measurement, element distribution in a thickness direction is attainable, and the aforementioned regions are specified. A calculated thickness of the portion where at least one of these regions exits may be considered to be the thickness of the diffusion layer 106.

Figure 1B:
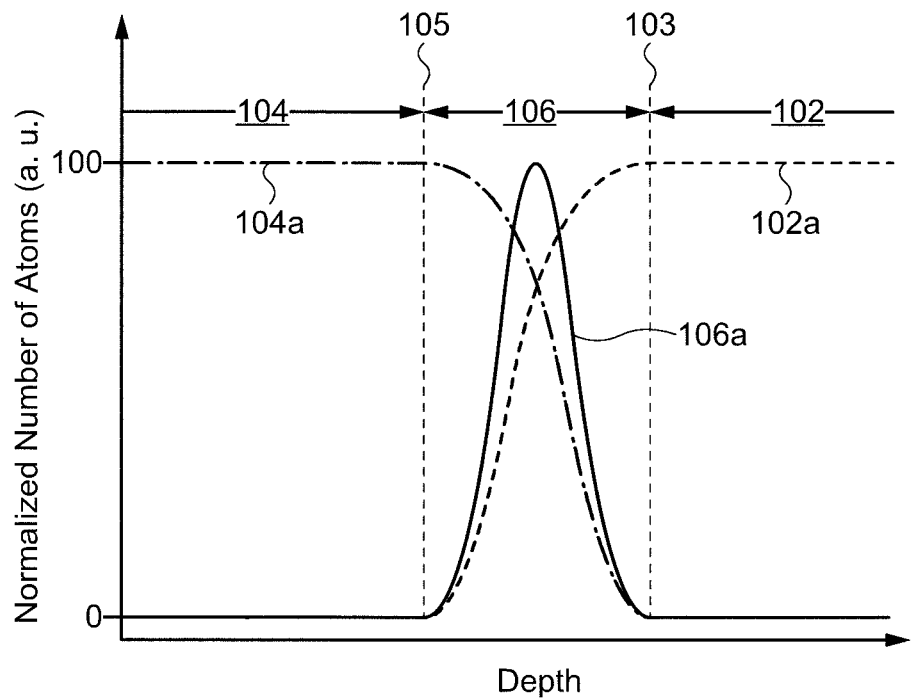
FIG. 1B is a schematic drawing of concentration profiles in a thickness direction of the wiring board.

FIG. 1B schematically shows concentration profiles of the first element, the first metal element, and the second metal element of the wiring board 100 in the thickness direction. Hereinafter, the vertical axes are each a normalized element concentration (i.e., the number of atoms of the first element, the first metal element, or the second metal element per unit volume) and the horizontal axes are each the depth of the wiring board 100 in FIG. 1B to FIG. 5B. The depth means a distance in a direction from a top surface of the first metal film 104 toward the substrate 102 along the normal line of the top surface of the first metal film 104.

As shown in FIG. 1B, the concentration 102a of the first element decreases in the thickness direction as it approaches the first metal film 104 from an interface 103 between the substrate 102 and the diffusion layer 106. Simultaneously, the concentration 104a of the second metal element decreases in the thickness direction as it approaches the substrate 102 from an interface 105 between the diffusion layer 106 and the first metal film 104. The variations of these concentrations may be continuous. Here, the interface 103 is a plane located between a region where the first metal element does not exist or is substantially undetectable and a region where the first metal element exists or is detectable and is closer to the substrate 102 than to the first metal film 104. The interface 105 means a plane located between a region where the first metal element does not exist or is substantially undetectable and a region where the first metal element exists or is detectable and is located closer to the first metal film 104 than to the substrate 102 (see FIG. 1B). The layer between these interfaces 103 and 105 is the diffusion layer 106 in which a plot of the concentration 106a of the first metal element against the depth provides at least one peak (FIG. 1B).

Hence, in the diffusion layer 106, a plot of the concentration 104a of the second metal element against the depth of the wiring board 100 (a dot dash line in FIG. 1B) intersects a plot of the concentration 102a of the first element against the depth (a dashed line in FIG. 1B). Note that the concentration 102a of the first element, the concentration 106a of the first metal element, and the concentration 104a of the second metal element may be measured with an EDX analysis or the like.

In the example shown in FIG. 1B, the concentration 104a of the second metal element decreases as it approaches the substrate 102 in the diffusion layer 106 and becomes substantially undetectable at the interface 103. In a similar way, the concentration 102a of the first element decreases as it approaches the first metal film 104 in the diffusion layer 106 and becomes substantially undetectable at the interface 105. In other words, the first element, the first metal element, and the second metal element coexist in the whole of the diffusion layer 106.

Figure 2A:
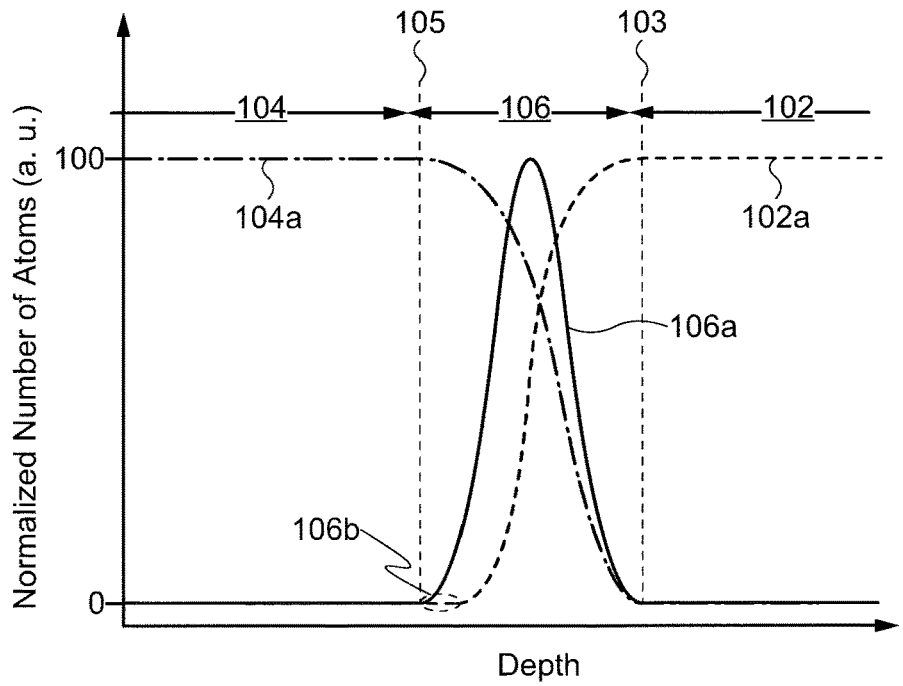
FIG. 2A and FIG. 2B are each a schematic drawing of element concentration profiles of a wiring board according to an embodiment in a thickness direction.
Figure 2B:
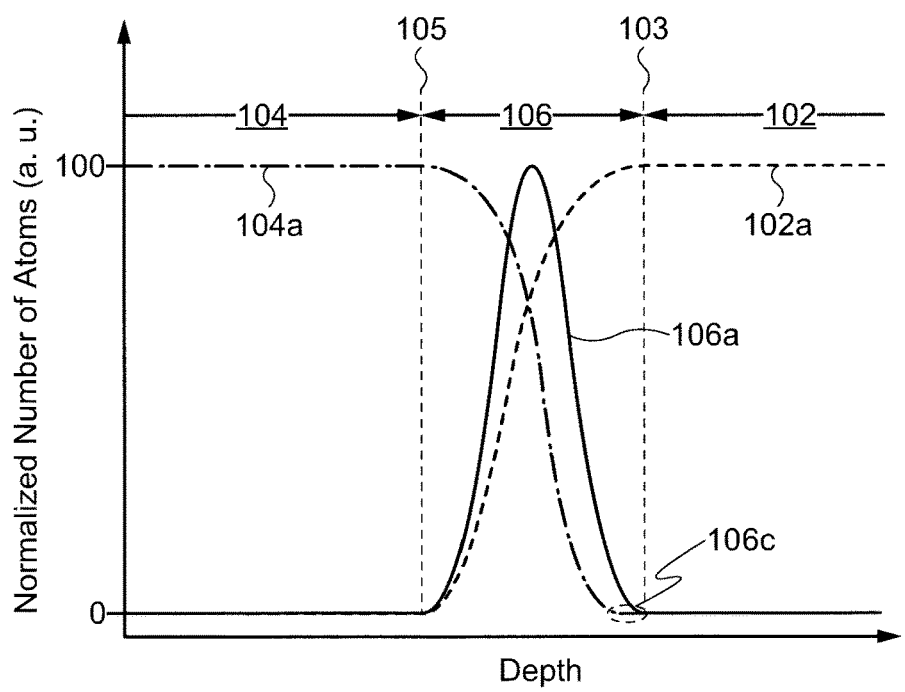

The concentration profiles of the first element and the second metal element in the diffusion layer 106 are not limited to those demonstrated in FIG. 1B. For example, the diffusion layer 106 may possess, on a side of the interface 105, a region 106b where the first element does not exist or is substantially undetectable as shown in FIG. 2A. Alternatively, the diffusion layer 106 may possess, on a side of the interface 103, a region 106c where the second metal element does not exist or is substantially undetectable as shown in FIG. 2B.

Figure 3A:
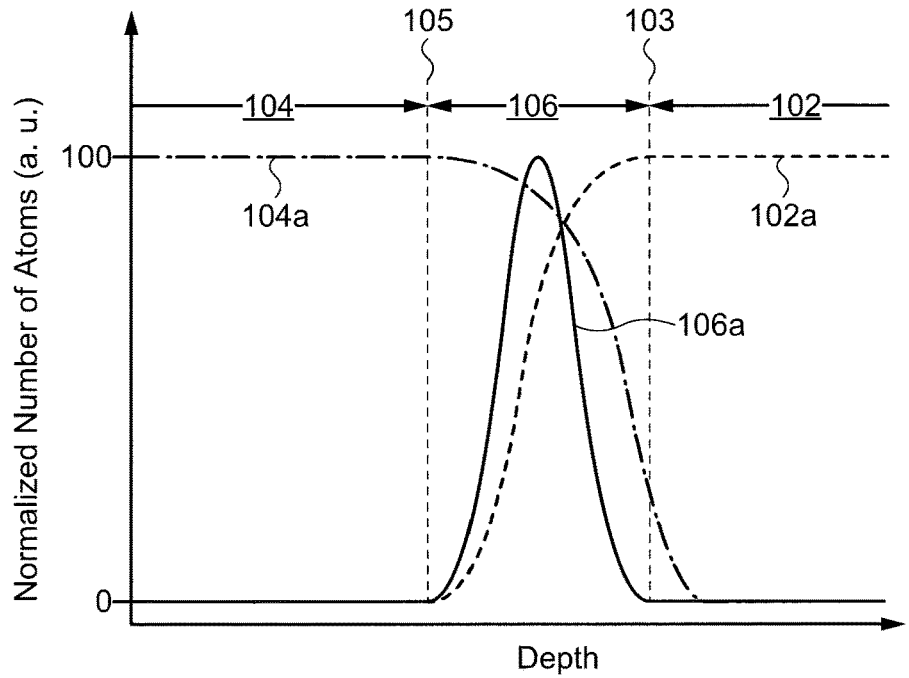
FIG. 3A and FIG. 3B are each a schematic drawing of element concentration profiles of a wiring board according to an embodiment in a thickness direction.
Figure 3B:
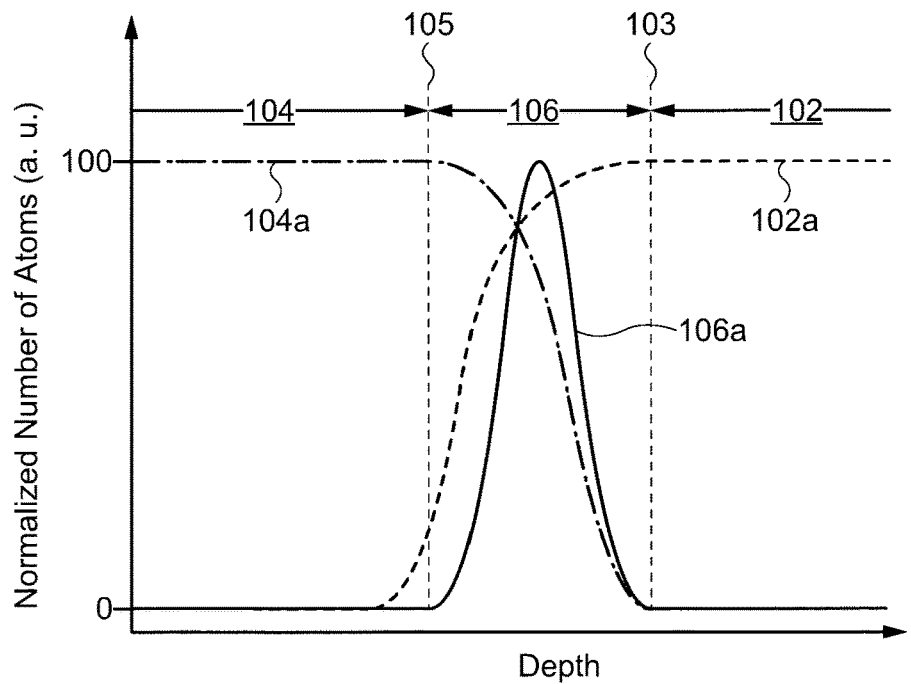

Alternatively, the second metal element may be contained not only in the diffusion layer 106 but also in the substrate 102 as shown in FIG. 3A. In this case, the concentration 104a of the second metal element in the substrate 102 decreases as it recedes from the interface 103. Conversely, the first element may be included not only in the diffusion layer 106 but also in the first metal film 104 (FIG. 3B). In this case, the concentration 102a of the first element in the first metal film 104 decreases as it recedes from the interface 105.

Figure 4A:
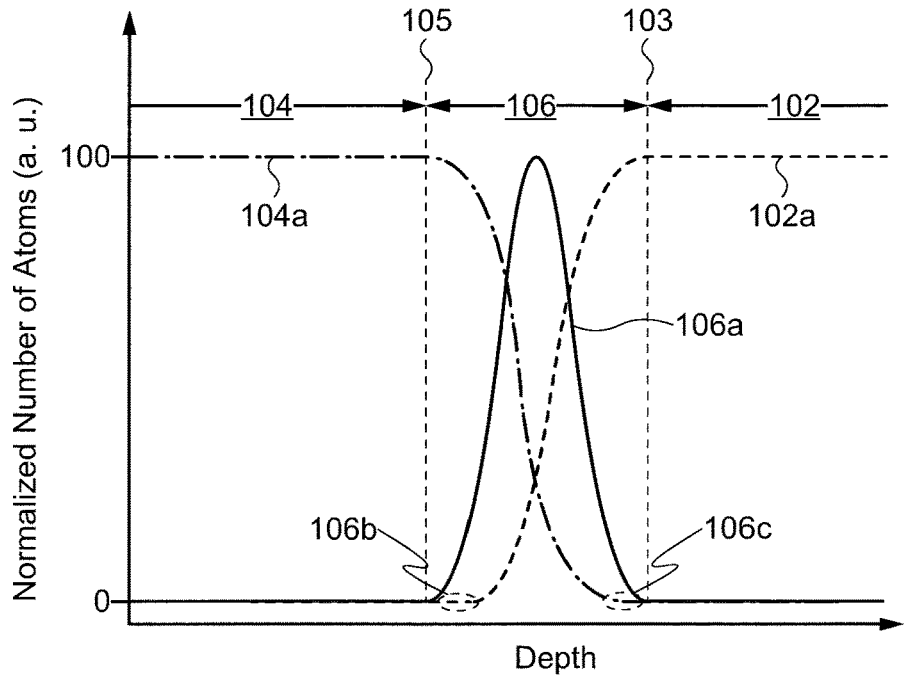
FIG. 4A and FIG. 4B are each a schematic drawing of element concentration profiles of a wiring board according to an embodiment in a thickness direction.

The diffusion layer 106 may be configured so that the aforementioned concentration profiles are combined. For example, the diffusion layer 106 may possess the region 106b and the region 106c on the sides of the interfaces 105 and 103, respectively, as shown in FIG. 4A. In this case, a region where the first element, the first metal element, and the second metal element coexist is sandwiched by the regions 106b and 106c.

Figure 4B:
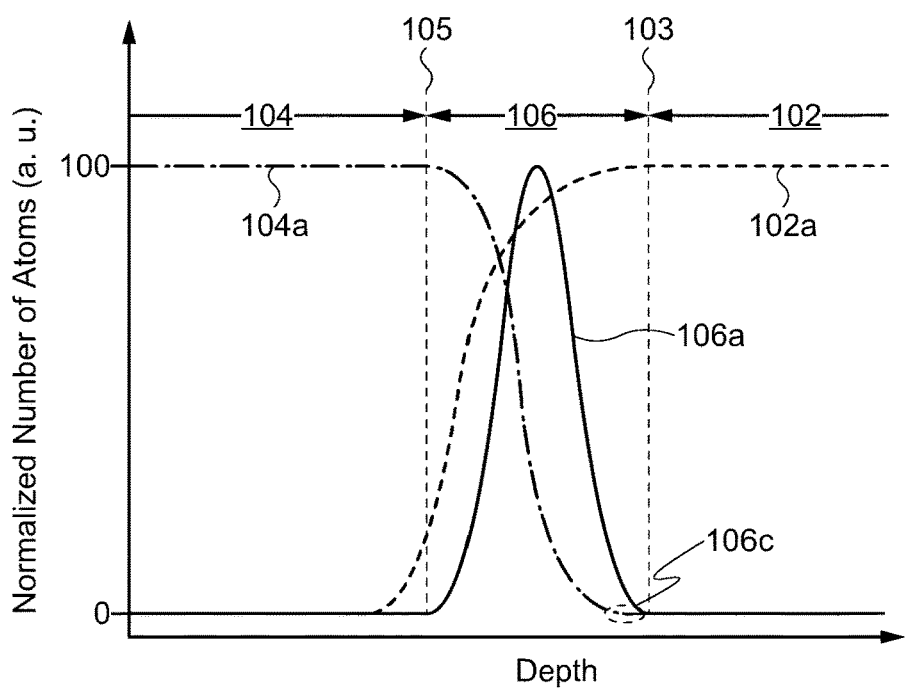
Figure 5A:
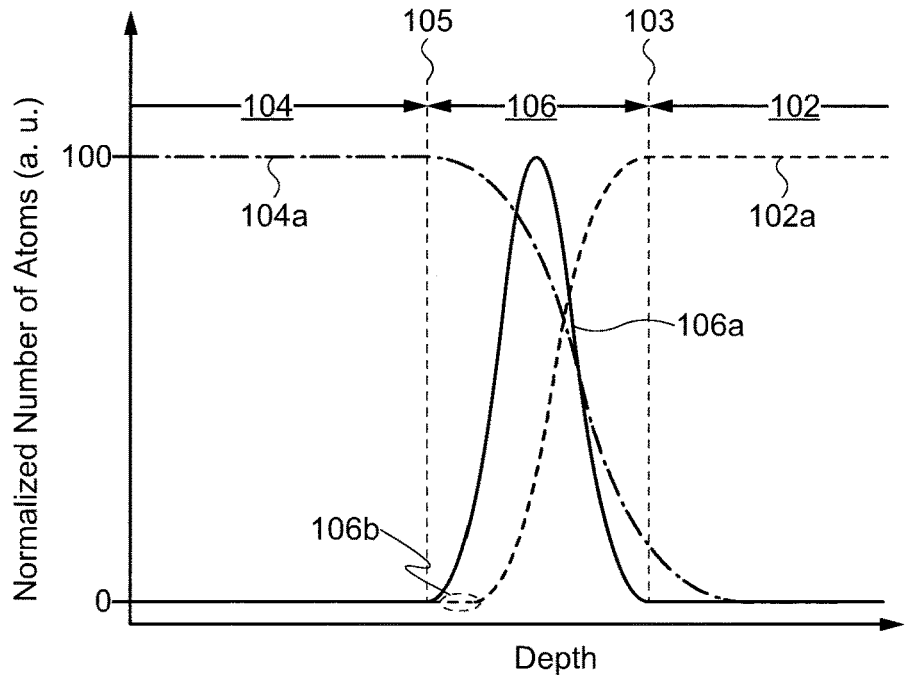
FIG. 5A and FIG. 5B are each a schematic drawing of element concentration profiles of a wiring board according to an embodiment in a thickness direction.
Figure 5B:
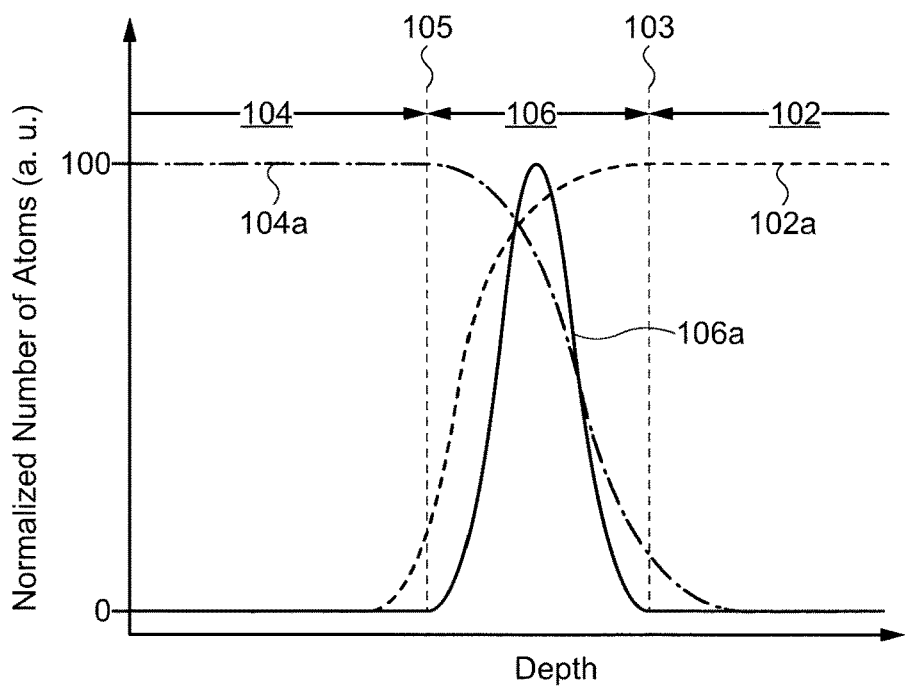

Alternatively, the diffusion layer 106 may possess the region 106c, and the first element may be included not only in the diffusion layer 106 but also in the first metal film 104 shown in FIG. 4B. Conversely, the diffusion layer 106 may possess the region 106b, and the second metal element may be included not only in the diffusion layer 106 but also in the substrate 102 as shown in FIG. 5A. Alternatively, the first element may be contained not only in the diffusion layer 106 but also in the first metal film 104, whereas the second metal element may be included not only in the diffusion layer 106 but also in the substrate 102 as shown in FIG. 5B.

In the case of any concentration profile, the plot of the concentration 104a of the second metal element against the depth of the wiring board 100 intersects the plot of the concentration 102a of the first element against the depth. Hence, at least one of the first element and the second metal element is included in any region of the diffusion layer 106 in addition to the first metal element, and there is no region where the first metal element is included but neither the first element nor the second metal element is included.

3. Modified Example

Figure 6A:
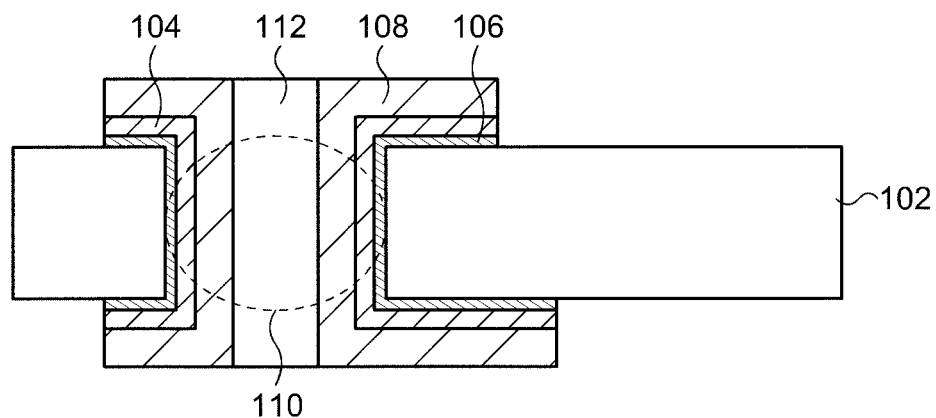
FIG. 6A and FIG. 6B are each a schematic cross-sectional view of a wiring board according to an embodiment.
Figure 6B:
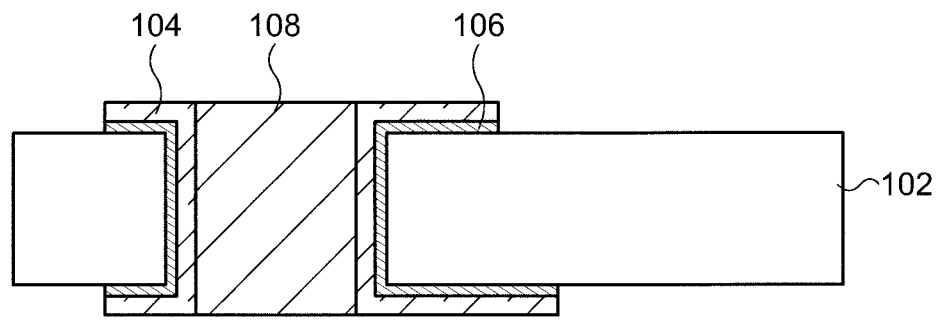

As shown in FIG. 6A, the substrate 102 of the wiring board 100 may possess a through hole 110. In this case, the diffusion layer 106 and the first metal film 104 are formed so as to cover upper and lower surfaces of the substrate 102 and a sidewall of the through hole 110. The second metal film 108 provided as an optional element may be arranged so as to cover the upper and lower surfaces of the substrate 102 and the sidewall of the through hole 110. When the through hole 110 is not entirely filled with the first metal film 104 or the second metal film 108, a filler 112 may be formed so as to fill the through hole 110. As the filler 112, an organic compound such as an epoxy resin, an acrylic resin, a polyimide, a polyamide, and a polyester is represented. An organic material such as silicon oxide may be mixed into the organic compound. Alternatively, the second metal film 108 or the first metal film 104 may be provided so as to fill the through hole 110 as shown in FIG. 6B. As described below, the first metal film 104 or a stack of the first metal film 104 and the second metal film 108 is capable of functioning as a through wiring for electrically connecting a variety of elements and semiconductor devices mounted over the substrate 102.

As experimentally proven in the Examples, it is possible to obtain firm adhesion between the substrate 102 and the first metal film 104 due to the presence of the diffusion layer 106 in the wiring board 100 having any of the aforementioned structures. In addition, since there is substantially no region where an oxide of the first element solely exists in the diffusion layer 106, the diffusion layer 106 has higher eching resistance than a film having a region substantially consisting of only the oxide of the first element. Hence, the diffusion layer 106 exhibits an eching rate almost the same as that of the first metal film 104, and etching (side etching) of the diffusion layer 106 located under the first metal film 104 hardly occurs during the etching of the first metal film 104. Particularly, when the diffusion layer 106 possesses the region where the first element, the first metal element, and the second metal element coexist, such side etching can be prevented and firm adhesion can be realized because the intermediate layer does not solely exist. Accordingly, a phenomenon that the first metal film 104 peels from the substrate 102 can be efficiently suppressed, which enables the production of a highly reliable wiring board and a semiconductor device including the wiring board.

Second Embodiment

In this embodiment, a manufacturing method of the wiring board 100 described in the First Embodiment is described. An explanation of the structure the same as or similar to that described in the First Embodiment may be omitted.

Figure 7:
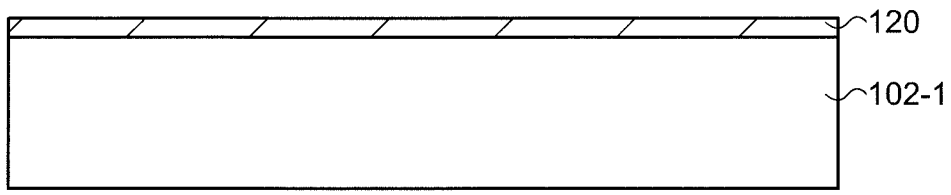
FIG. 7 represents schematic cross-sectional views showing a manufacturing method of a wiring board according to an embodiment.
Figure 7:
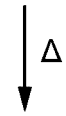
Figure 7:
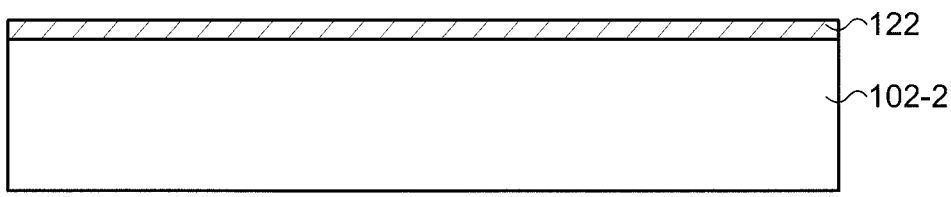
Figure 7:
Figure 7:
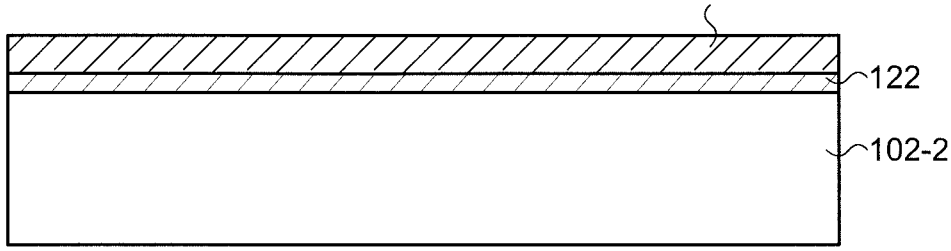
Figure 7:
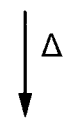
Figure 7:
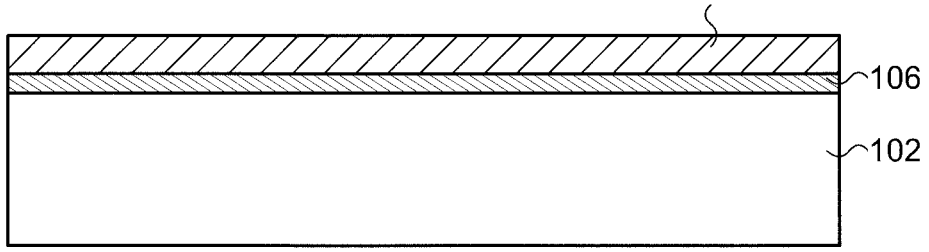

First, a first intermediate layer 120 serving as a precursor of the diffusion layer 106 is formed over a substrate 102-1 (FIG. 7, S1). The first intermediate layer 120 contains the oxide of the first element and is formed with a sputtering method, a physical vapor deposition (PVP) method such as electron-beam evaporation and vacuum evaporation, a sol-gel method, or the like. When a sol-gel method is utilized, tetraethyl zinc or a metal alkoxide such as tetraethoxyethane and tetraethoxyzirconium is used as a raw material, and a solution or a mixture containing this raw material is applied on the substrate 102-1 with a spin-coating method, a dip-coating method, a printing method, or the like, followed by hydrolyzing tetraethyl zinc or the metal alkoxide to prepare the first intermediate layer 120. A thickness of the first intermediate layer 120 may be equal to or more than 5 nm and equal to or less than 20 nm or 15 nm. The thickness of the first intermediate layer 120 may be equal to or more than 5 nm and equal to or less than 20 nm or equal to or more than 5 nm and equal to or less than 15 nm.

The thickness of the intermediate layer may be measured with a thin-film calibration-curve method. Specifically, a metal thin film having a known thickness and containing the metal included in the intermediate layer 120 is used as a standard sample, and the intensity of fluorescent X-rays obtained by applying X-rays is measured. A plurality of samples with different thicknesses is used to prepare a calibration curve showing a relationship between the thickness and the fluorescent X-ray intensity. Subsequently, the same measurement is performed on the intermediate layer 120 formed over the substrate 102-1 to estimate the thickness thereof from the fluorescence X-ray intensity using the calibration curve. In this measurement, a plurality of regions in the intermediate layer 120 is subjected to the measurement, and an average of the thicknesses obtained from these regions can be employed as the thickness of the intermediate layer 120. Five regions including the four corners and the center of the substrate 102-1 may be selected as the plurality of regions, for example.

As an example of the measurement apparatus, an X-ray Fluorescence Analyzer SFT9450 manufactured by Seiko Instruments Inc., which is equipped with both a semiconductor detector and a proportional counter as a detector as well as a collimator with a diameter of 0.1 mm, is represented. According to the method described above, the thickness of the intermediate layer 120 can be measured with this apparatus under the conditions that a tube current is 1500 μA and a measurement time is 30 seconds.

Subsequently, a heating treatment is conducted on the substrate 102-1 and the first intermediate layer 120 formed thereover to diffuse the first element contained in the substrate 102-1 to the first intermediate layer 120. The heating treatment may be performed at a temperature set from a range equal to or higher than 100° C., 200° C. 250° C., or 350° C. and equal to or lower than 700° C., 600° C., or 550° C. This temperature range may be equal to or higher than 100° C. and equal to or lower than 700° C., equal to or higher than 200° C. and equal to or lower than 700° C., equal to or higher than 250° C. and equal to or lower than 600° C., or equal to or higher than 350° C. and equal to or lower than 550° C. The heating time depends on the heating temperature and may be equal to or longer than 10 minutes, 15 minutes, or 30 minutes and equal to or shorter than 5 hours or 2 hours. A typical heating time is 1 hour. The heating time may be equal to or longer than 10 minutes and equal to or shorter than 5 hours, equal to or longer than 15 minutes and equal to or shorter than 5 hours, or equal to or longer than 30 minutes and equal to or shorter than 2 hours. When the heating is conducted at a temperature higher than a heat resistance temperature (glass-transition temperature or melting point) of the substrate 102-1, it is preferred to perform the heating treatment in a short time from 1 second to 30 seconds. The first intermediate layer 120 is converted to a second intermediate layer 122 containing the first metal element and the first element with this heating treatment (FIG. 7, S2). At least a part of the first metal element exists as an oxide. The substrate 102-1 and the first intermediate layer 120 are respectively converted to a substrate 102-2 and the second intermediate layer 122 by the interdiffusion.

Subsequently, a metal film 104-1 is formed over the second intermediate layer 122. The metal film 104-1 may be formed with an electroless plating method, a sputtering method, a chemical vapor deposition (CVD) method including a metal organic chemical vapor deposition (MOCVD) method, a PVD method such as vacuum evaporation and electron-beam evaporation, or the like. The temperature at this time is a room temperature (equal to or higher than 20° C. and equal to or lower than 25° C.) or higher, and the formation of the metal film 104-1 may be carried out at a temperature equal to or lower than 100° C. or 50° C. (FIG. 7, S3). The temperature at the formation of the metal film 104-1 may be equal to or higher than a room temperature and equal to or lower than 100° C. or equal to or higher than a room temperature and equal to or lower than 50° C.

Subsequently, a heating treatment is conducted again to diffuse the first metal contained in the metal film 104-1 into the second intermediate layer 122. The temperature and time of the heating treatment may be appropriately selected from the ranges described above. At the same time, the first element contained in the substrate 102-2 may further diffuse into the second intermediate layer 122. The second intermediate layer 122 is converted to the diffusion layer 106 having any of the concentration profiles described in the First Embodiment with this heating treatment (FIG. 7, S4). Here, the metal film 104-1 after the interdiffusion with the second intermediate layer 122 is defined as the first metal film 104. Although not illustrated, the second metal film 108 may be formed over the first metal film 104. The second metal film 108 may be formed with a sputtering method, a CVD method, a PVD method, or the like. Alternatively, the second metal film 108 may be prepared using the first metal film 104 as a seed layer supplied with a current.

Figure 8:
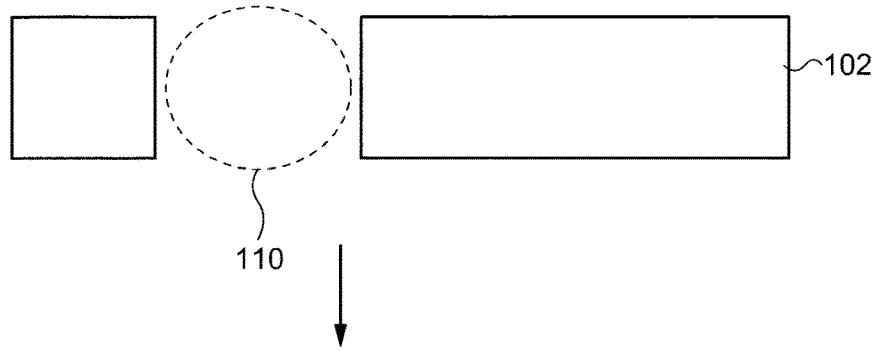
FIG. 8 represents schematic cross-sectional views showing a manufacturing method of a wiring board according to an embodiment.
Figure 8:
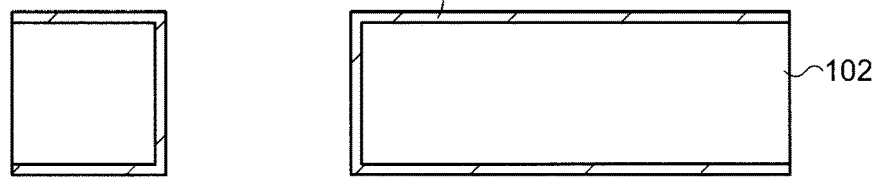
Figure 8:
Figure 8:
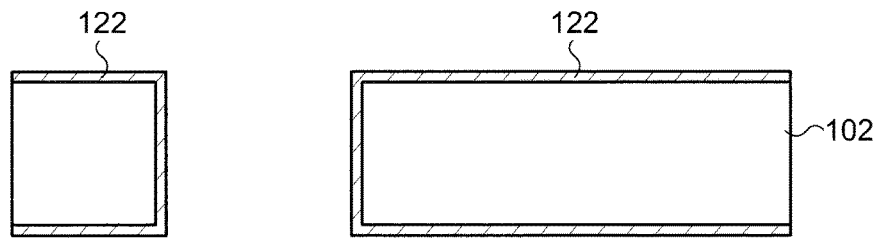
Figure 8:
Figure 8:
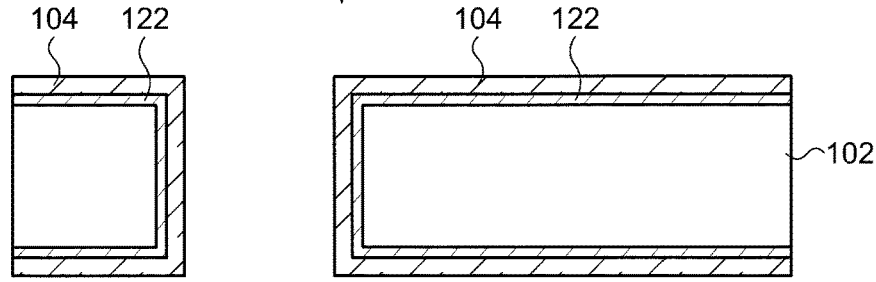
Figure 8:
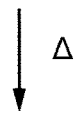

When the wiring board 100 having the through hole 110 is manufactured, the through hole 110 is first formed in the substrate 102 (FIG. 8, S10). The through hole 110 may be formed with etching such as plasma etching and wet etching, laser irradiation, or mechanical processing such as sandblast and supersonic drilling. If necessary, the substrate 102 may be treated with hydrofluoric acid after forming the through hole 110 to planarize the upper and lower surfaces of the substrate 102 and the sidewall of the through hole 110.

After the formation of the through hole 110, the first intermediate layer 120 is formed so as to cover the upper and lower surfaces of the substrate 102 and the sidewall of the through hole 110 (FIG. 8, S11). Subsequently, the first intermediate layer 120 is converted to the second intermediate layer 122 by the heating treatment described above (FIG. 8, S12), which is followed by the formation of the metal film 104-1 over the second intermediate layer 122 (FIG. 8, S13). After that, the aforementioned heating treatment is carried out to convert the second intermediate layer 122 to the diffusion layer 106 (FIG. 9, S14).

Subsequently, the second metal film 108 is fabricated on a part of the upper and lower surfaces of the substrate 102. For example, resist masks 124 are formed on the first metal film 104 so as to cover a region where the second metal film 108 is not to be provided as shown by S15 in FIG. 9. The resist masks 124 may be formed by applying and curing a fluid resist. However, since the substrate 102 possesses the through hole 110, the resist masks 124 can be efficiently formed by sticking film resists on the upper and lower surfaces of the substrate 102, followed by exposing and developing the resists.

Figure 9:
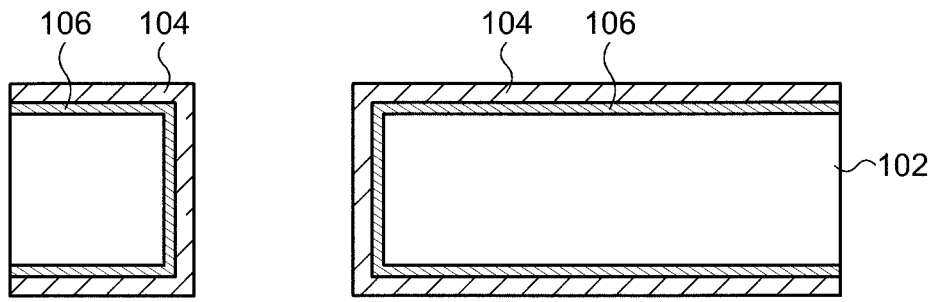
FIG. 9 represents schematic cross-sectional views showing a manufacturing method of a wiring board according to an embodiment.
Figure 9:
Figure 9:
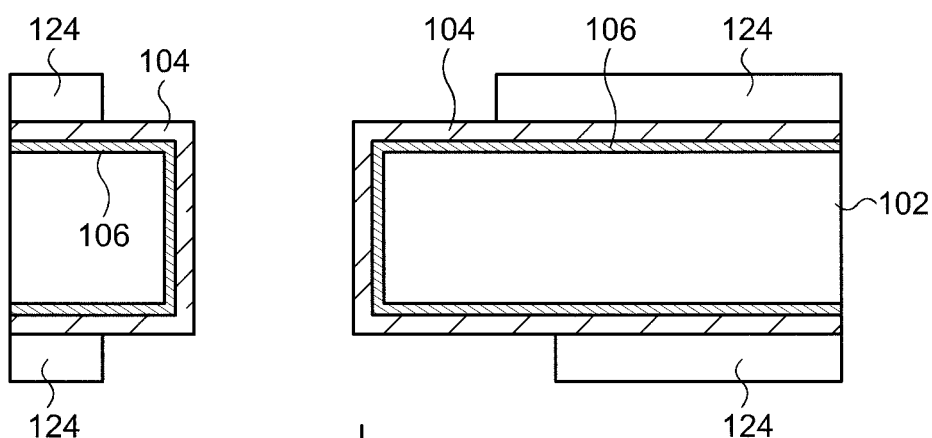
Figure 9:
Figure 9:
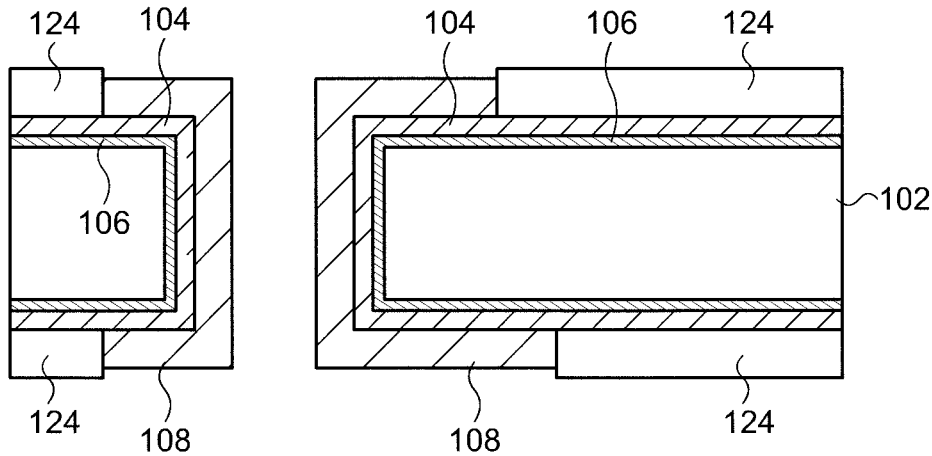
Figure 10:
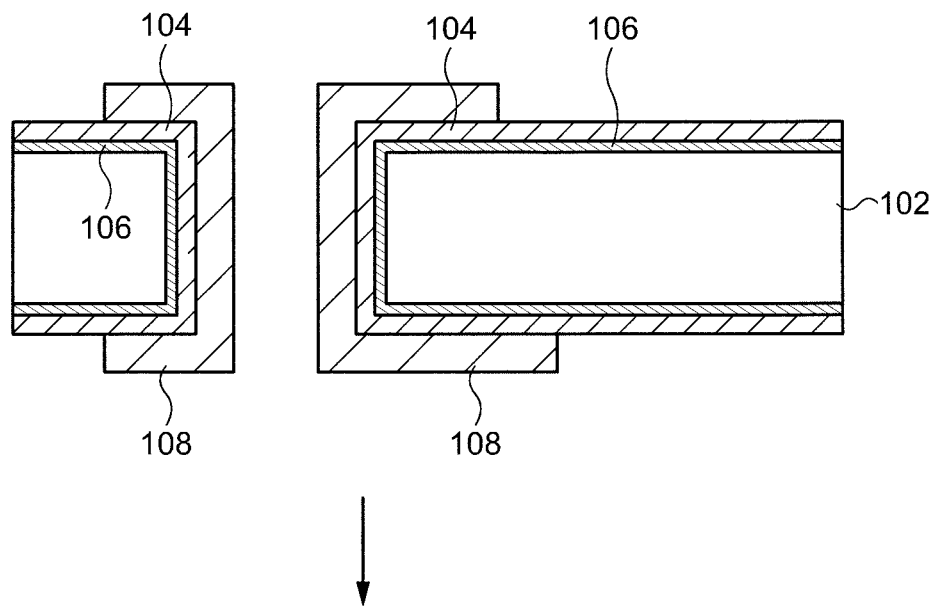
FIG. 10 represents schematic cross-sectional views showing a manufacturing method of a wiring board according to an embodiment.
Figure 10:
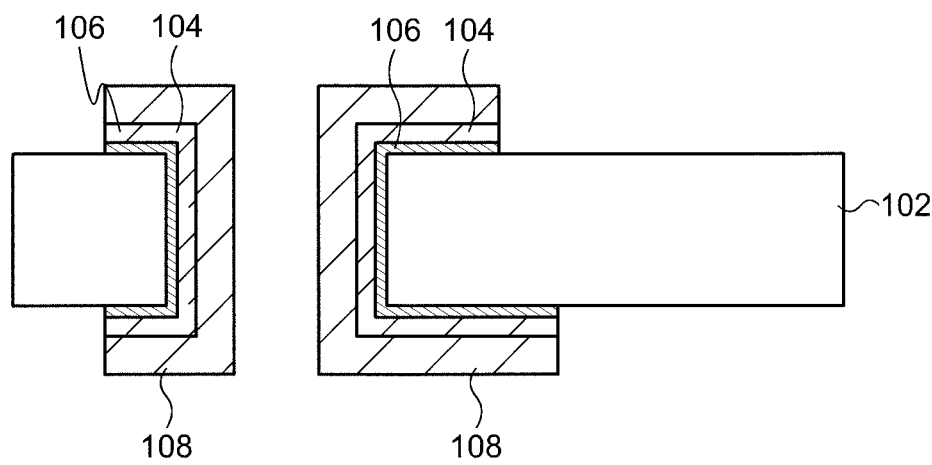

Subsequently, electroplating is carried out by supplying a current to the first metal film 104, by which the second metal film 108 is formed over the first metal film 104 exposed from the resist masks 124 (FIG. 9, S16). After that, the resist masks 124 are removed (FIG. 10, S17), and then the first metal film 104 and the diffusion layer 106, which are exposed from the second metal film 108, are removed with etching (FIG. 10, S18). The etching may be performed using an etchant containing an acid such as sulfuric acid. Through these processes, the wiring board 100 having the through hole 110 can be manufactured. Although a detailed explanation is omitted, the through hole 110 may be prepared after forming the first metal film 104 or the second metal film 108.

As described above, since the diffusion layer 106 according to the present disclosure exhibits almost the same etching rate as that of the first metal film 104, side etching of the diffusion layer 106 does not occur or is extremely slow even in the etching process (S18) of the first metal film 104. Therefore, it is possible to provide a sufficient contact area between the first metal film 104 and the substrate 102 through the diffusion layer 106. As a result, peeling of the first metal film 104 and the second metal film 108 can be efficiently prevented.

Third Embodiment

In the present embodiment, semiconductor devices each utilizing the wiring board 100 described in the First and Second Embodiments are explained. Here, semiconductor devices each utilizing the wiring board 100 obtained by Step S18 in FIG. 10 are explained as a typical example.

Figure 11:
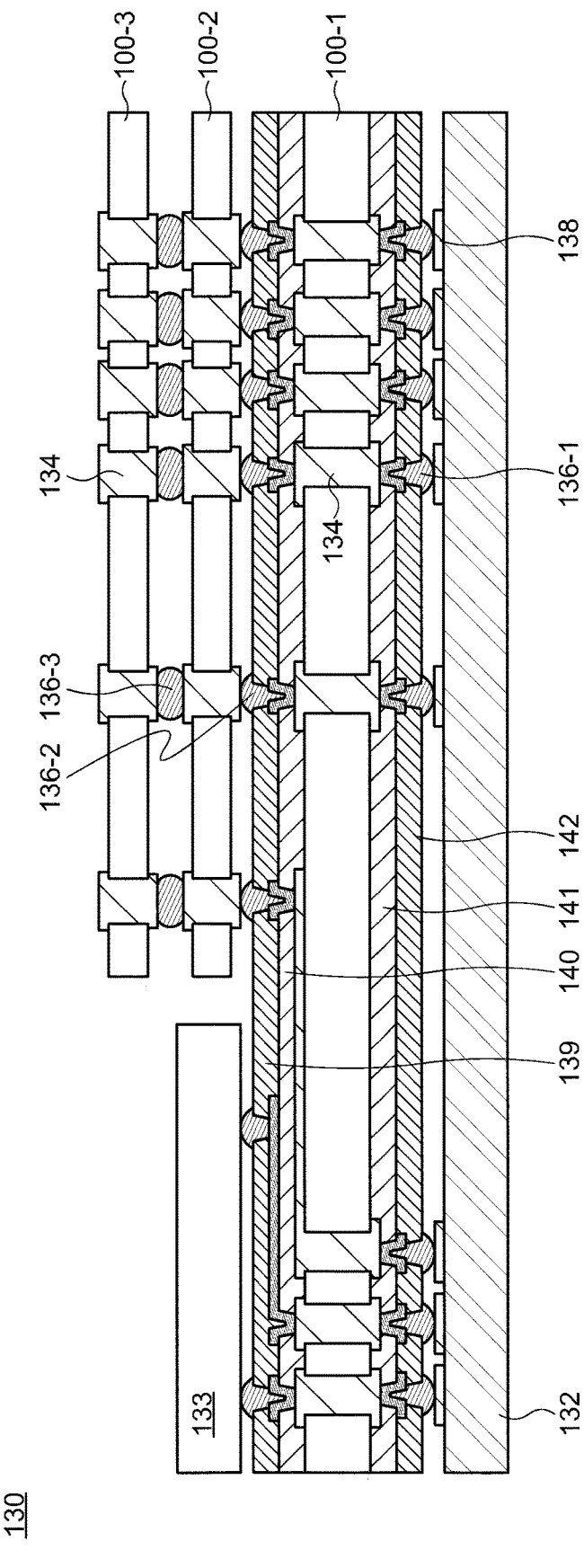
FIG. 11 is a schematic cross-sectional view of a semiconductor device including wiring boards according to an embodiment.

The semiconductor device 130 demonstrated in FIG. 11 possesses a main substrate 132 and a plurality of wiring boards 100 (wiring boards 100-1, 100-2, and 100-3) stacked thereover. The number of wiring boards 100 is not limited and is determined according to the performance required to the semiconductor device 130. A variety of semiconductor chips (a memory device and a central processing unit) and semiconductor elements (a micro-electromechanical system (MEMS) and the like) are connected to the main substrate 132. FIG. 11 shows an example in which a central processing unit 133 is mounted on the main substrate 132. As described in the First Embodiment, the wiring boards 100 each function as a through wiring and possess the second metal film 108 and the first metal film 104 provided on the upper and lower surfaces of the substrate 102 (hereinafter, these metal films are collectively referred to as a connection wiring 134), where the connection wirings 134 contribute to the electrical connection in a vertical direction in the semiconductor device 130. The connection wirings 134 of the wiring board 100-1 in the lowermost layer are electrically connected to terminals 138 provided over the main substrate 132 via bumps 136-1 through via holes or wirings arranged between interlayer insulating films 141 and 142. The connection wirings 134 formed in the upper portion of the wiring board 100-1 are electrically connected to the wiring board 100-2 via bumps 136-2 through via holes or wirings arranged between interlayer insulating layers 139 and 140. Similarly, the wiring board 100-2 and the wiring board 100-3 are also electrically connected via bumps 136-3. A metal such as indium, copper, and gold or an alloy such as solder is included in the bumps 136.

Figure 12:
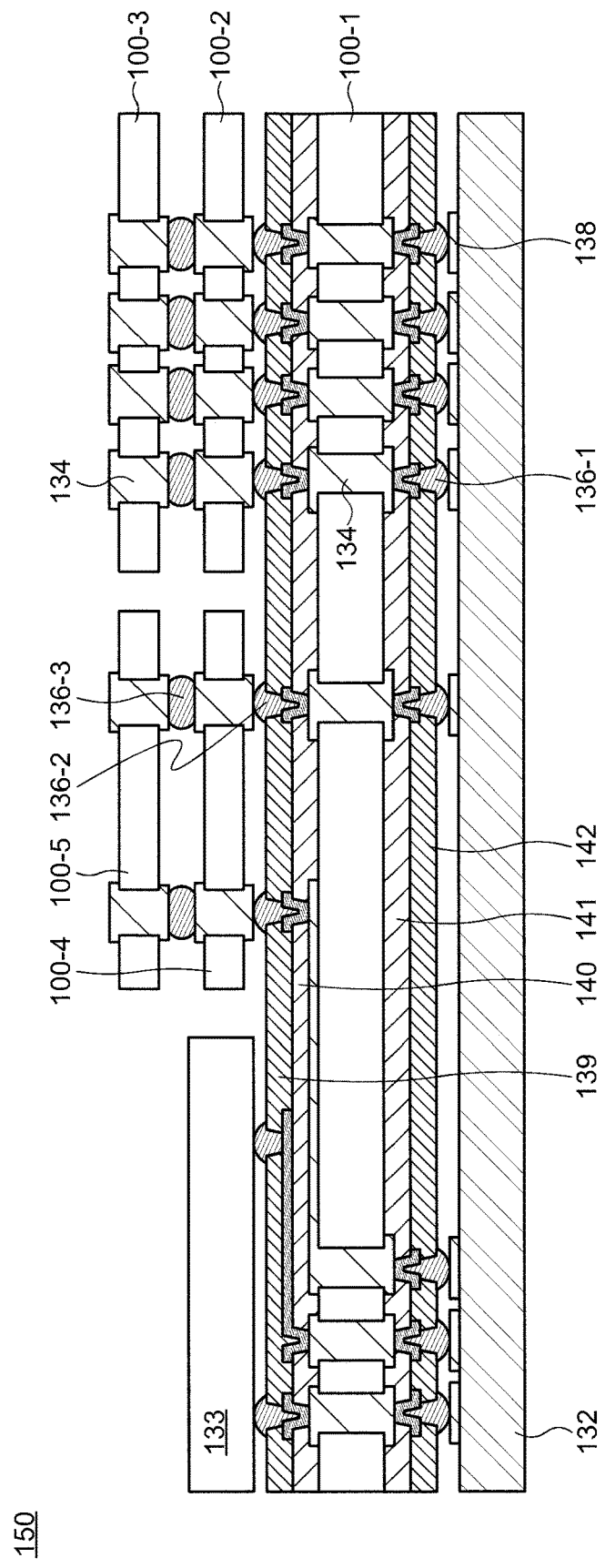
FIG. 12 is a schematic cross-sectional view of a semiconductor device including wiring boards according to an embodiment.

As demonstrated by the semiconductor device 150 shown in FIG. 12, the stacked wiring boards 100 may be different in size and shape from one another, and the number of the wiring boards 100 stacked over the main substrate 132 may be varied. In the example shown in FIG. 12, two wiring boards 100-4 and 100-5 are stacked in one region, while three wiring boards 100-1, 100-2, and 100-3 are stacked in another region.

Figure 13:
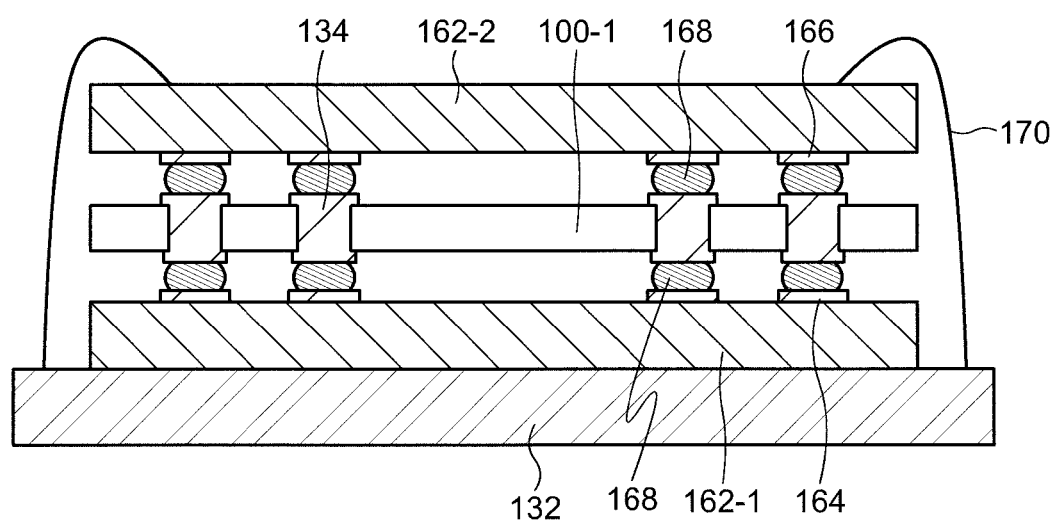
FIG. 13 is a schematic cross-sectional view of a semiconductor device including wiring boards according to an embodiment.

The semiconductor device 160 shown in FIG. 13 possesses a structure in which a plurality of semiconductor chips 162-1 and 162-2 are stacked over the main substrate 132 via the wiring board 100-1. Terminals 164 and 166 are respectively formed on the semiconductor chips 162-1 and 162-2 and are electrically connected to the connection wirings 134 of the wiring board 100-1 through bumps 168. A driver chip is represented as an example of the semiconductor chip 162-1, whereas a memory chip and the like are represented as an example of the semiconductor chip 162-2. With this structure, the semiconductor chips 162-1 and 162-2 are electrically connected to each other. Moreover, the semiconductor chip 162-2 and the main substrate 132 may be electrically connected to each other with a wire 170. In FIG. 11 to FIG. 13, the connection wirings 134 are illustrated so as to be directly connected to the bumps 136 or 168, another wiring such as a lead wiring may be provided between the bumps 136 or 168 and the connection wiring 134.

EXAMPLES

1. Example 1

In the present example, the results of an analysis of the elements contained in the wiring board 100 fabricated according to the manufacturing method described in the Second Embodiment are described.

The structure of the wiring board 100 is as illustrated in FIG. 1A. The specific manufacturing method was as described below. The first intermediate layer 120 (15 nm thickness) was formed by forming a film containing zinc oxide over a glass substrate (30 cm×40 cm, 0.5 mm thickness, and 5 nm surface roughness) with a sol-gel method. After that, heating was conducted at 550° C. for 1 hour to convert the first intermediate layer 120 to the second intermediate layer 122. Subsequently, an electroless plating method was applied to form a copper film (0.5 µm thickness) over the second intermediate layer 122 as the first metal film 104. After that, heating was conducted again at 450° C. for 1 hour to convert the second intermediate layer 122 to the diffusion layer 106.

As a comparable example, samples were prepared using three substrates respectively having surface roughnesses of 5 nm, 200 nm, and 1 µm (1000 nm) where the first metal film 104 was directly formed over each substrate without forming the first intermediate layer 120. These samples respectively correspond to the samples 8 to 10 shown below in Table 1 and do not possess the diffusion layer 106.

An elemental analysis was carried out by FIB-processing the heated wiring board 100 to expose a cross section thereof, and the cross section was subjected to the EDX analysis from the side of the substrate 102 so as to scan the interlayer interfaces. The intensity of the obtained characteristic X-rays was converted to the atomic composition proportion to evaluate the element distribution in the depth direction. As a measurement apparatus, a transmission electron microscope (model HD-2700 manufactured by Hitachi High-Technologies Ltd.) equipped with an elemental analyzer was used. The substrate 100 was irradiated with an electron beam with a beam diameter of approximately 0.2 nm at the accelerating voltage of 200 kV, and the generated characteristic X-rays were detected by a Si drift detector. As the elemental analyzer, EMAX Evolution manufactured by Horiba Ltd. was used. The energy resolution was approximately 130 eV, the X-ray take-off angle was 24.8°, and the solid angle was 2.2 sr. The data-capturing points were 100, and each data-capturing time was 1 second.

Figure 14:
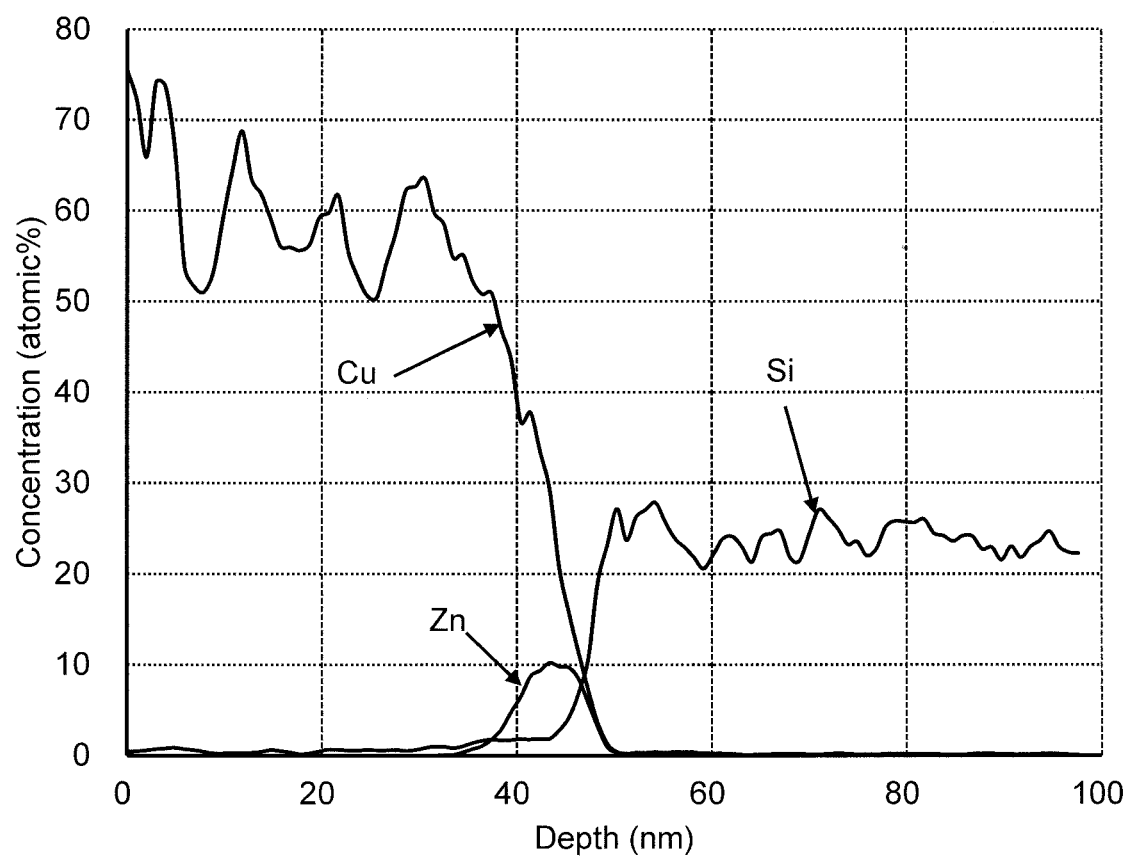
FIG. 14 represents the results of energy dispersive X-ray analysis of a wiring board according to an embodiment.

The EDX analysis results are shown in FIG. 14. In FIG. 14, the concentration changes of zinc, silicon, and copper with respect to the depth are illustrated. As shown in FIG. 14, zinc was not substantially detected in a region from 0 to 35 nm depth and a region deeper than 50 nm. Hence, it can be understood that the interface 103 between the substrate 102 and the diffusion layer 106 and the interface 105 between the diffusion layer 106 and the first metal film 104 are respectively located at the 35 nm and 50 nm depths. It was confirmed that the plot of the concentration of zinc contained in the diffusion layer 106 has one peak in the diffusion layer 106.

From FIG. 14, it is proven that the concentration of silicon which is the first element contained in the substrate 102 decreases as it approaches the first metal film 104 from the interface 103. In a similar way, it is understood that the concentration of copper contained in the first metal film 104 also decreases as it approaches the substrate 102 from the interface 105. From these results, it was confirmed that zinc which is the first metal element is included in the diffusion layer 106, and silicon and copper which are respectively the first element and the second element are also included in the diffusion layer 106. Moreover, the concentration plots of silicon and copper against the depth intersect each other in the diffusion layer 106. From this result, it was found that at least one of the first element and the second metal element is included in any region of the diffusion layer 106 in addition to the first metal element.

2. Example 2

In this example, the results of evaluation of the diffusion layer 106 on the adhesion between the substrate 102 and the first metal film 104 are demonstrated.

The first metal film 104 of the wiring board 100 prepared in the Example 1 was supplied with a current to form a copper film (3 µm thickness) as the second metal film 108 with an electroplating method. In the present Example, the thickness of the first intermediate layer 120 was fixed to be 15 nm, and the temperature of the heating after forming the second metal film 108 was varied to evaluate the effects of the diffusion layer 106. Furthermore, the samples 8 to 10, that is, the wiring boards without the diffusion layer 106 were also evaluated as a comparable example.

The effects of the diffusion layer 106 on the adhesion between the first metal film 104 and the substrate 102 were evaluated by a tape-peeling test and an etching test. The former was carried out by sticking an adhesive tape having a polyimide as a substrate (a polyimide adhesive tape for heat-resistant insulation, model No. 36 manufactured by NITTO DENKO CORPORATION) and then peeling the adhesive tape, followed by visually observing the adhesive tape. The latter was carried out by performing etching on the wiring board 100 and then visually confirming whether the peeling of the first metal film 104 or the second metal film 108 occurred during the etching. The etching was conducted using a 1% aqueous solution of ammonium persulfate as an etchant at 23° C. for 1 minute.

though the surface roughness of the substrate 102 was 200 nm (sample 9), and it was confirmed from the results of the sample 10 that a fairly rough surface having a surface roughness of 1000 nm is required in the case where the diffusion layer 106 is not provided. However, an attempt to form such a thick diffusion layer 106 with a 1000 nm thickness makes the microfabrication difficult as described above and results in significant disadvantages in preparing a wiring with a line-space (L/S) of 10 μm/10 μm. Hence, implementation of the diffusion layer 106 according to the present disclosure enables the formation of a microfabricated wiring over a substrate with a surface roughness from which no anchor effect is usually expected, that is, a substrate with an extremely high surface flatness. This feature contributes to the production of a wiring board such as a high-frequency circuit board which requires a high flatness to a wiring.

TABLE 1

Evaluatoin of Effects of Diffusion Layer 106 with Tape-Peeling Test and Etching Test

| Sample No. | Surface roughness of substrate (nm) | Diffusion Layer 106 | Thickness of first intermediate layer 120 (nm) | Heating temperature[b] (° C.) | Tape-peeling test[c] | Etching test[c] |
|---|---|---|---|---|---|---|
| 1 | 5 | y | 15 | 80 | x | x |
| 2 | 5 | y | 15 | 150 | x | x |
| 3 | 5 | y | 15 | 250 | ○ | x |
| 4 | 5 | y | 15 | 350 | ○ | ○ |
| 5 | 5 | y | 15 | 450 | ○ | ○ |
| 6 | 5 | y | 15 | 550 | ○ | ○ |
| 7 | 5 | y | 15 | 600 | ○ | ○ |
| 8[a] | 5 | none | — | 450 | x | — |
| 9[a] | 200 | none | — | 450 | x | — |
| 10[a] | 1000 | none | — | 450 | ○ | — |

[a] Comparable examples without diffusion layer 106.
[b] Heating temperature after forming second metal film 108.
[c] x: Peeling was observed. ○: No peeling was observed.

The results are summarized in Table 1. As shown in Table 1, in the case where the diffusion layer 106 having the structure described in the present embodiment is used, no peeling was observed in the tape-peeling test, and it was confirmed that the first metal film 104 and the second metal film 108 remain over the substrate 102 if the heating temperature after the formation of the second metal film 108 is equal to or higher than 250° C. (samples No. 3 to 7). In addition, no peeling was observed in both the tape-peeling test and the etching test when the heating temperature was equal to or higher than 350° C. (samples No. 4 to 7). On the other hand, with respect to the comparable example without the diffusion layer 106 (sample No. 8), that is, in the case where the first intermediate layer 120 is not formed over the substrate 102, peeling was observed in the tape-peeling test even though the heating temperature after forming the second metal film 108 was 450° C. These results clearly demonstrate that the formation of the diffusion layer 106 according to the present disclosure allows the formation of a metal wiring over the substrate 102 with firm adhesion, while the adhesion between the first metal film 104 and the substrate 102 is small and the first metal film 104 and the second metal film 108 readily peel from the substrate 102 in the case where the diffusion layer 106 according to the present disclosure is not provided.

Here, an increase in surface roughness of a substrate generally improves adhesion with a metal film formed thereover because the anchor effect is brought about. However, peeling was observed in the tape-peeling test even The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is properly understood that another effect different from that provided by the modes of the aforementioned embodiments is achieved by the present invention if the effect is obvious from the description in the specification or readily conceived by persons ordinarily skilled in the art.

What is claimed is:

1. A wiring board comprising:
   a substrate containing a first element;
   a diffusion layer in contact with the substrate, the diffusion layer containing a first metal element;
   a first metal film in contact with the diffusion layer, the first metal film containing a second metal element; and
   a second metal film over and in contact with the first metal film,
   wherein the diffusion layer has at least a region containing the first element and the first metal element and a region containing the first metal element and the second metal element,
   the first metal element exists as an oxide in the diffusion layer, the substrate has a through hole, and the diffusion layer, the first metal film, and the second metal film continuously cover an upper surface and a lower surface of the substrate and a sidewall of the through hole.

2. The wiring board according to claim 1, wherein a concentration of the second metal element in the diffusion layer decreases as it approaches the substrate in a depth direction, and a concentration of the first element in the diffusion layer decreases as it approaches the first metal film in the depth direction.

3. The wiring board according to claim 2, wherein the diffusion layer has a region where a plot of the concentration of the second metal element against a thickness of the diffusion layer intersect a plot of the concentration of the first element against the thickness.

4. The wiring board according to claim 1, wherein the diffusion layer includes a region in which the first element, the first metal element, and the second metal element coexist.

5. The wiring board according to claim 1, wherein the first element is silicon, and the second metal element is selected from copper, titanium, chromium, nickel, and gold.

6. The wiring board according to claim 5, wherein the first metal element is selected from zinc, titanium, zirconium, aluminum, and tin.

7. The wiring board according to claim 1, wherein the first element is contained in the first metal film.

8. The wiring board according to claim 1, wherein the second metal element is contained in the substrate.

9. The wiring board according to claim 1, wherein the substrate is selected from a glass substrate, a quartz substrate, a semiconductor substrate, and a ceramic substrate.

10. The wiring board according to claim 1, wherein a thickness of the diffusion layer is equal to or more than 1 nm and less than 10 nm.

11. The wiring board according to claim 1, further comprising a bump in contact with the second metal film.

\* \* \* \* \*